(12) United States Patent
Summers

(10) Patent No.: US 10,305,498 B1
(45) Date of Patent: May 28, 2019

(54) FREQUENCY AND PHASE MEASUREMENT CIRCUIT

(71) Applicant: Cadence Design Systems, Inc., San Jose, CA (US)

(72) Inventor: Mark A. Summers, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/146,169

(22) Filed: Sep. 28, 2018

(51) Int. Cl.
| | | |
|---|---|---|
| H03L 7/087 | (2006.01) |
| H03L 7/091 | (2006.01) |
| H03L 7/093 | (2006.01) |
| H03L 7/095 | (2006.01) |
| H03L 7/097 | (2006.01) |
| G06F 17/50 | (2006.01) |

(52) U.S. Cl.
CPC .............. H03L 7/087 (2013.01); H03L 7/091 (2013.01); H03L 7/093 (2013.01); H03L 7/095 (2013.01); H03L 7/097 (2013.01); *G06F 17/5045* (2013.01)

(58) Field of Classification Search
CPC .................................................. H03L 2207/04
See application file for complete search history.

(56) References Cited

U.S. PATENT DOCUMENTS

| | | | | |
|---|---|---|---|---|
| 5,499,393 A * | 3/1996 | Fukui | ...................... | H03J 7/065 455/209 |
| 6,771,133 B2 * | 8/2004 | Lautzenhiser | .......... | H03L 7/189 327/156 |
| 7,084,709 B1 * | 8/2006 | Leong | ..................... | H03L 7/087 327/156 |
| 7,495,518 B1 * | 2/2009 | Lee | ........................... | H03L 7/08 327/158 |
| 7,952,436 B2 * | 5/2011 | Wu | ....................... | H03L 7/0898 327/156 |
| 8,009,786 B2 * | 8/2011 | Haralabidis | ............ | H04B 15/04 327/147 |
| 8,054,137 B2 * | 11/2011 | Osman | ..................... | H03C 3/09 327/156 |
| 8,952,836 B2 * | 2/2015 | Zhu | ....................... | H03M 1/164 327/144 |
| 2002/0149503 A1 * | 10/2002 | Lautzenhiser | .......... | H03L 7/189 341/17 |
| 2003/0076177 A1 * | 4/2003 | Fischer | ................... | H03L 7/107 331/17 |
| 2006/0066368 A1 * | 3/2006 | Gabato, Jr. | .......... | H03K 5/1504 327/158 |

(Continued)

*Primary Examiner* — Adam D Houston
(74) *Attorney, Agent, or Firm* — Schwegman Lundberg & Woessner, P.A.

(57) ABSTRACT

Various embodiments provide for a circuit for measuring a frequency difference, a phase difference, or both of at least two clock signals (e.g., a reference clock signal and a feedback clock signal). In particular, various embodiments described herein may be used in a circuit design to convert an input phase of two clock signals to a frequency difference, which may be outputted in the form of a digital word. Additionally, various embodiments described herein may be used in a circuit design to convert an input phase of two clock signals as phase difference output, which may be outputted in the form of a digital word. Various embodiments can provide the frequency difference, the phase difference, or both in near real-time and with only a small amount of latency.

16 Claims, 10 Drawing Sheets

(56) References Cited

U.S. PATENT DOCUMENTS

| | | | |
|---|---|---|---|
| 2006/0097794 A1* | 5/2006 | He | G11B 7/0053 331/16 |
| 2007/0052463 A1* | 3/2007 | Abel | H03L 7/0812 327/158 |
| 2007/0075759 A1* | 4/2007 | Metz | H03L 7/0812 327/158 |
| 2009/0015338 A1* | 1/2009 | Frey | H03L 7/0802 331/16 |
| 2009/0225903 A1* | 9/2009 | van Waasen | H03C 3/40 375/316 |
| 2012/0307923 A1* | 12/2012 | Bogdan | H03H 17/0251 375/260 |
| 2012/0313676 A1* | 12/2012 | Nguyen | H03L 7/23 327/156 |
| 2015/0180594 A1* | 6/2015 | Chakraborty | H03L 7/0802 455/87 |
| 2015/0214966 A1* | 7/2015 | Tong | H03L 7/0898 327/157 |
| 2016/0033625 A1* | 2/2016 | Floyd | G01S 7/4021 342/174 |
| 2017/0063386 A1* | 3/2017 | Hiraku | H03L 7/095 |
| 2017/0250692 A1* | 8/2017 | Motozawa | H03L 7/0802 |
| 2019/0028108 A1* | 1/2019 | Gao | H03D 3/24 |

* cited by examiner

FREQUENCY AND PHASE MEASUREMENT CIRCUIT

TECHNICAL FIELD

Embodiments described herein relate to a circuit for measuring frequency and phase.

BACKGROUND

Phase Lock Loop (PLL) circuitry often finds application in locking an internal clock signal to an input/output (I/O) clock signal by achieving phase alignment between the internal clock signal (internal clock) to the I/O clock signal (I/O clock). By using a PLL to lock an internal clock to an I/O clock, a clock generation system (that is generating the internal clock) can ensure that the internal clock is within the required frequency range before enabling downstream circuits or transmitting data. Generally, the lock declaration needs to be accurate and achieved with low latency to prevent adding startup time to a larger system that is using the clock generation system.

Traditionally, a clock generation system can use one or more digital counters to measure frequency difference between an input clock signal (e.g., I/O clock) and an output clock signal (e.g., internal clock). In particular, the clock generation system may compare the counts of two clock signals for a short period and declare lock if the two clock signals are sufficiently close to each other. However, due to clock speed limitations, this traditional digital-counter method cannot achieve both high accuracy and low latency. For instance, a current implementation of this traditional digital-counter method may require two iterations to declare a lock and may have a minimum of +/−2 steps of error. Due to the high level of error in the lock determination, a lock wait time has to be set to the max expected lock time with margin of error. Additionally, if the output clock signals contain spread-spectrum or similar modulation, the use of high speed clocks to reduce latency and improve accuracy can be much less effective.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
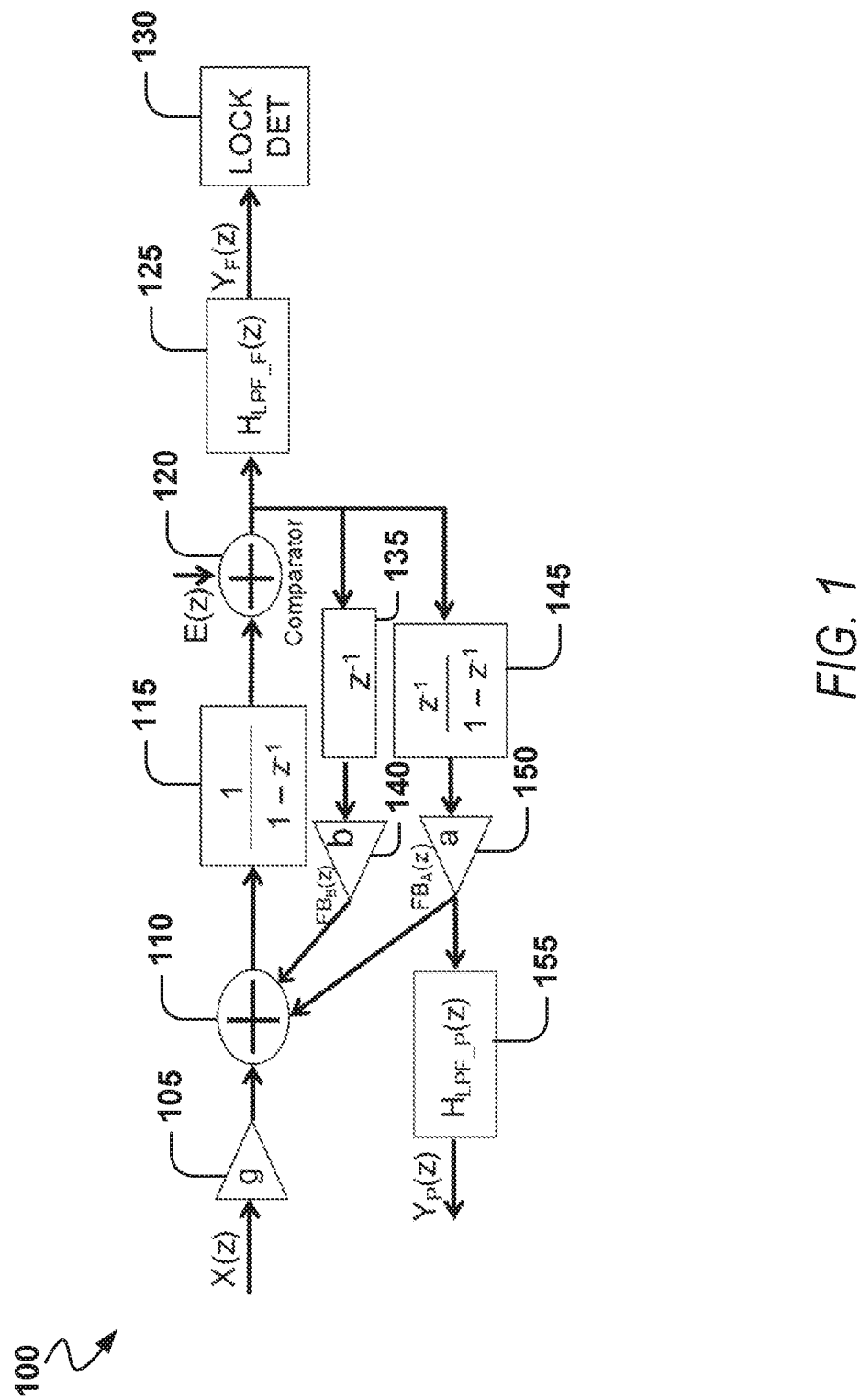
FIG. 1 is a diagram illustrating an example frequency and phase measurement system, in accordance with various embodiments.

Various embodiments provide for a circuit for measuring a frequency difference, a phase difference, or both of at least two clock signals (e.g., a reference clock signal and a feedback clock signal). In particular, various embodiments described herein may be used in a circuit design to convert an input phase of two clock signals to a frequency difference, which may be outputted in the form of a digital word. Additionally, various embodiments described herein may be used in a circuit design to convert an input phase of two clock signals as phase difference output, which may be outputted in the form of a digital word. Various embodiments can provide the frequency difference, the phase difference, or both in near real-time and with only a small amount of latency. In comparison to traditional methodologies, an embodiment described herein can represent an improved (e.g., faster and more accurate) method for measuring a frequency difference, a phase difference, or both. By using an embodiment described herein, a circuit system can achieve fast acquisition of a reference clock signal and with high resolution.

For example, an embodiment described herein may be used with respect to a phase lock loop (PLL) circuit to accurately measure a frequency error, a phase error, or both between a reference clock signal and a feedback clock signal of the PLL, which can facilitate PLL lock determination between the reference clock signal and the feedback clock signal. By using various embodiments described herein in place conventional methodologies for measuring frequency and phase error, a PLL can improve the PLL's lock time (e.g., by obviating the need for extra margin in lock time to account for error) and PLL's accuracy of lock determination between the reference clock signal and the feedback clock signal (e.g., by indicating a lock based on true measurement of frequency and or phase).

Additionally, using various embodiments described herein in place conventional methodologies for measuring frequency and phase error can improve testability of a PLL or enable test capabilities of the PLL. For instance, an embodiment can improve testability of a PLL by improving measurement of phase error in locked condition, which can indicate loop issues for the PLL such as high static phase error. In particular, the phase output of an embodiment can provide information on static phase offset in a PLL, which can be used to detect a high static phase offset that indicates one or more defects in the loop of the PLL. An embodiment can improve testability of a PLL by providing a means to internally and accurately measure the time required for PLL lock (e.g., circuit components with manufacturing defects may require excessive lock times). Furthermore, an embodiment can improve testability of a PLL by measuring the time for recovery from frequency or phase steps in the loop, which can provide the ability to measure PLL dynamics.

With respect to enabling test capabilities of a PLL, an embodiment can enable testing of PLL lock time from initialization. For instance, a counter can be started when a PLL is enabled, and the count value (of the counter) can be latched when a lock is detected using an embodiment for measuring a frequency error, a phase error, or both. An embodiment can enable testing of PLL frequency step recovery. For instance, a counter can be reset and latched with the lock detect using an embodiment for measuring a frequency error, a phase error, or both. The PLL can be disturbed to cause it to unlock, and then the counter can be used record the time required to re-lock. This time can provide information on the PLL bandwidth.

Some embodiments provide accurate measurement of frequency difference, phase difference, or both between two low speed clock inputs, and may do so with low latency (e.g., in near real-time).

Various embodiments described here can be implemented (e.g., by an electronic design automation (EDA) system) within a circuit design as a circuit block (e.g., IP block) that measures frequency difference, phase difference, or both for at least two clock signals. For example, the circuit block may be implemented with respect to a PLL circuit design, such as one that operates in either integer-N or fractional-N PLL mode.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example frequency and phase measurement system 100, in accordance with various embodiments. As shown, the frequency and phase measurement system 100 comprises a first gain component 105, a combiner component 110, an analog integrator 115, a comparator 120, a first low-pass filter 125, lock determination circuitry 130, a delay component 135, a second gain component 140, a digital integrator 145, a third gain component 150, and a second low-pass filter 155. $X(z)$ can comprise an analog signal representing a sampled phase difference between a reference clock signal (reference clock) and a feedback clock signal (feedback clock). The first gain component 105 applies a gain factor of 'g' to $X(z)$ to generate as output an analog signal, which can noise shape the $X(z)$ signal. The gain factor of 'g' can be flexible and adjusted based on how large or small $X(z)$. Each of the first gain component 105, the second gain component 140, and the third gain component 150 can comprise an amplifier, such as an operational amplifier.

The combiner component 110 combines an analog signal generated by the first gain component 105, an analog signal generated by the second gain component 140, and an analog signal generated by the third gain component 150. For some embodiments, the combiner component 110 generates as output an analog signal based on combining the analog signals. Depending on the embodiment, the combiner component 110 can comprise a node that couples together the outputs of the first gain component 105, an analog signal generated by the second gain component 140, and the analog signal generated by the third gain component 150 represent feedback signals, and the combiner component 110 generates an output analog signal by subtracting these feedback signals from the analog signal generated by the first gain component 105. The analog integrator 115 receives an analog signal, generated by the combiner component 110, and generates as output an analog signal that is provided to the comparator 120. For some embodiments, the analog signal generated by the analog integrator 115 is a time integral of the analog signal received by the analog integrator 115 (the digital signal received from the combiner component 110). Depending on the embodiment, the analog integrator 115 can comprise a capacitor coupled to ground.

According to some embodiments, the comparator 120 comprises a digitizing comparator (e.g., clocked comparator) that converts the analog signal provided by the analog integrator into a digital signal (e.g., 0's and 1's that logically represent -1's and +1's). The comparator 120 can be implemented using an amplifier (e.g., operational amplifier) and a digital amplifier. $E(z)$ can represent a quantization error internally added by the comparator 120; $E(z)$ may comprise a flat noise that is shaped by the loop via a second-order high pass filter, as illustrated by the $E(z)*(1-z^{-1})^2$ term in Equation 1 below. The comparator 120 generates the digital signal as output, which is received by the first low-pass filter 125, the delay component 135, and the digital integrator 145.

Based on the digital signal received from the comparator 120, the first low-pass filter 125 generates as output a digital signal $Y_F(z)$ that represents a frequency difference between the reference clock and the feedback clock. The digital signal generated by the first low-pass filter 125 may comprise a digital word that represents the frequency difference. Overall, the first low-pass filter 125 can generate the digital signal $Y_F(z)$ in near real time and with low amount of latency relative to the first gain component 105 receiving the analog signal $X(z)$. The digital signal $Y_F(z)$ can represent a conversion of the input analog signal $X(z)$ (representing sampled phase) to frequency in the form of a digital word. The signal transfer function implemented in the system 100 for generating $Y_F(z)$ may be expressed as Equation 1:

$$Y_F(z) = \frac{g*X(z)*(1-z^{-1}) + E(z)*(1-z^{-1})^2}{1+(a+b-2)*z^{-1}+(1-b)*z^{-2}} * H_{LPF\_F}(z)$$

For some embodiments, when a=1 and b=1, the transfer function may be expressed as $Y_F(z)=(g*(1-z^{-1})*X(z)+(1-z^{-1})^2*E(z))*H_{LPF\_F(z)}$.

The first low-pass filter 125 can comprise a digital filter, such as finite impulse response (FIR) filters (e.g., min-phase 36 tap FIR filter). For various embodiments, the first low-pass filter 125 comprises a digital filter with a low latency and steep roll-off outside the signal band. The first low-pass filter 125 can filter out quantization noise present in the digital signal received from the comparator 120.

The lock determination circuitry 130 receives the digital signal $Y_F(z)$ and determines a lock condition between the reference clock and the feedback clock based on the frequency difference represented by the digital signal $Y_F(z)$. Depending on the embodiment, the lock determination circuitry 130 forms part of a PLL that is using the system 100 to measure frequency and phase error of the reference and feedback clocks.

Based on the digital signal received from the comparator 120, the delay component 135 generates a digital signal having a predetermined cycle delay (e.g., one cycle delay). For some embodiment, the delay component 135 comprises a digital flip-flop. The second gain component 140 receives the delayed digital signal generated from the delay component 135 and applies a gain factor of 'b' to the delayed digital signal to generate an analog feedback signal $FB_B(Z)$. For some embodiments, the gain factor b is equal to 1. As shown, the analog feedback signal $FB_B(Z)$ is received by the combiner component 110, which feeds the analog feedback signal $FB_B(Z)$ back into a signal path between the first gain component 105 and the analog integrator 115. As noted herein, the combiner component 110 can feed the analog feedback $FB_B(Z)$ back into the signal path by subtracting the analog feedback signal $FB_B(Z)$ from the signal being generated by the first gain component 105. For some embodiments, the delay component 135 and the second gain component 140 represent a feed-forward (delay-only) feedback path. The feed-forward feedback path can limit the number of consecutive +1's or −1's being generated by the comparator 120, which can ensure that quantization noise is properly shaped. Additionally, the configuration of the feed-forward feedback path can ensure that the output from the comparator 120 is fed back to the signal integrator path (represented by the first gain component 105, the combiner component 110, and the analog integrator 115) through a low latency path.

Based on the digital signal received from the comparator 120, the digital integrator 145 generates a digital signal having a predetermined cycle delay (e.g., one cycle delay). For some embodiments, the digital signal generated by the digital integrator 145 is a time integral of the digital signal received by the digital integrator 145 (the digital signal received from the comparator 120). For some embodiments, the digital signal generated by the digital integrator 145 represents the number of −1's and +1's the digital integrator 145 has observed being outputted by the comparator 120. The digital integrator 145 can be implemented using one or more digital filters, such as first-order or second-order infinite impulse response (IIR) filters. In this way, the digital integrator 145 can function as digital counter or accumulator for counting those −1's and +1's. For some embodiments, the digital signal outputted by the digital integrator 145 comprises a digital word (e.g., 4-bit digital word, such as a 4-bit sign magnitude signal with 1 sign bit and 3 magnitude bits) representing the current count of −1's and +1's. The third gain component 150 receives the delayed digital signal generated from the digital integrator 145 and applies a gain factor of 'a' to the delayed digital signal to generate an analog feedback signal $FB_A(Z)$. For some embodiments, the gain factor a is equal to 1. As shown, the analog feedback signal $FB_A(Z)$ is received by the combiner component 110, which feeds the analog feedback signal $FB_A(Z)$ back into a signal path between the first gain component 105 and the analog integrator 115. As noted herein, the combiner component 110 can feed the analog feedback $FB_A(Z)$ back into the signal path by subtracting the analog feedback signal $FB_A(Z)$ from the signal being generated by the first gain component 105. For some embodiments, the digital integrator 145 and the third gain component 150 represent an integrator feedback path that can remove (e.g., a majority) of the low frequency content in the X(z) analog signal, which in turn can reduce dynamic range requirements in the signal integrator path (represented by the first gain component 105, the combiner component 110, and the analog integrator 115).

As also shown, the analog feedback signal $FB_A(Z)$ is received by the second low-pass filter 155. Based on the analog feedback signal $FB_A(Z)$ received from the third gain component 150, the second low-pass filter 155 generates as output a digital signal $Y_P(z)$ that represents a phase difference between the reference clock and the feedback clock. For some embodiments, the phase difference represented by the digital signal $Y_P(z)$ is more accurate than the sampled phase difference represented by the analog signal X(z). The digital signal generated by the second low-pass filter 155 may comprise a digital word that represents the frequency difference. Similar to the digital signal $Y_F(z)$, the second low-pass filter 155 can generate the digital signal $Y_P(z)$ in near real time and with low amount of latency relative to the first gain component 105 receiving the analog signal X(z). The signal transfer function implemented in the system 100 for generating $Y_P(z)$ may be expressed as Equation 2:

$$Y_P(z) = \frac{g*X(z)*z^{-1} + E(z)*(1-z^{-1})*z^{-1}}{1+(a+b-2)*z^{-1}+(1-b)*z^{-2}} * H_{LPF\_F}(z)$$

For some embodiments, when a=1 and b=1, the transfer function may be expressed as $Y_P(z) = (g*X(z)*z^{-1} + E(z)*(1-z^{-1})*z^{-1})*H_{LPF\_P(z)}$.

The second low-pass filter 155 can comprise a digital filter, such as an infinite impulse response (IIR) filter (e.g., two cascaded, first-order digital IIR filters). The second low-pass filter 155 can filter out quantization noise present in the digital signal received from the comparator 120.

As noted herein, for some embodiment the frequency difference represented by the digital signal $Y_F(z)$, the phase difference represented by the digital signal $Y_P(z)$, or both can be used to improve or enable testability of a circuit, such as a PLL as described herein.

Figure 2:
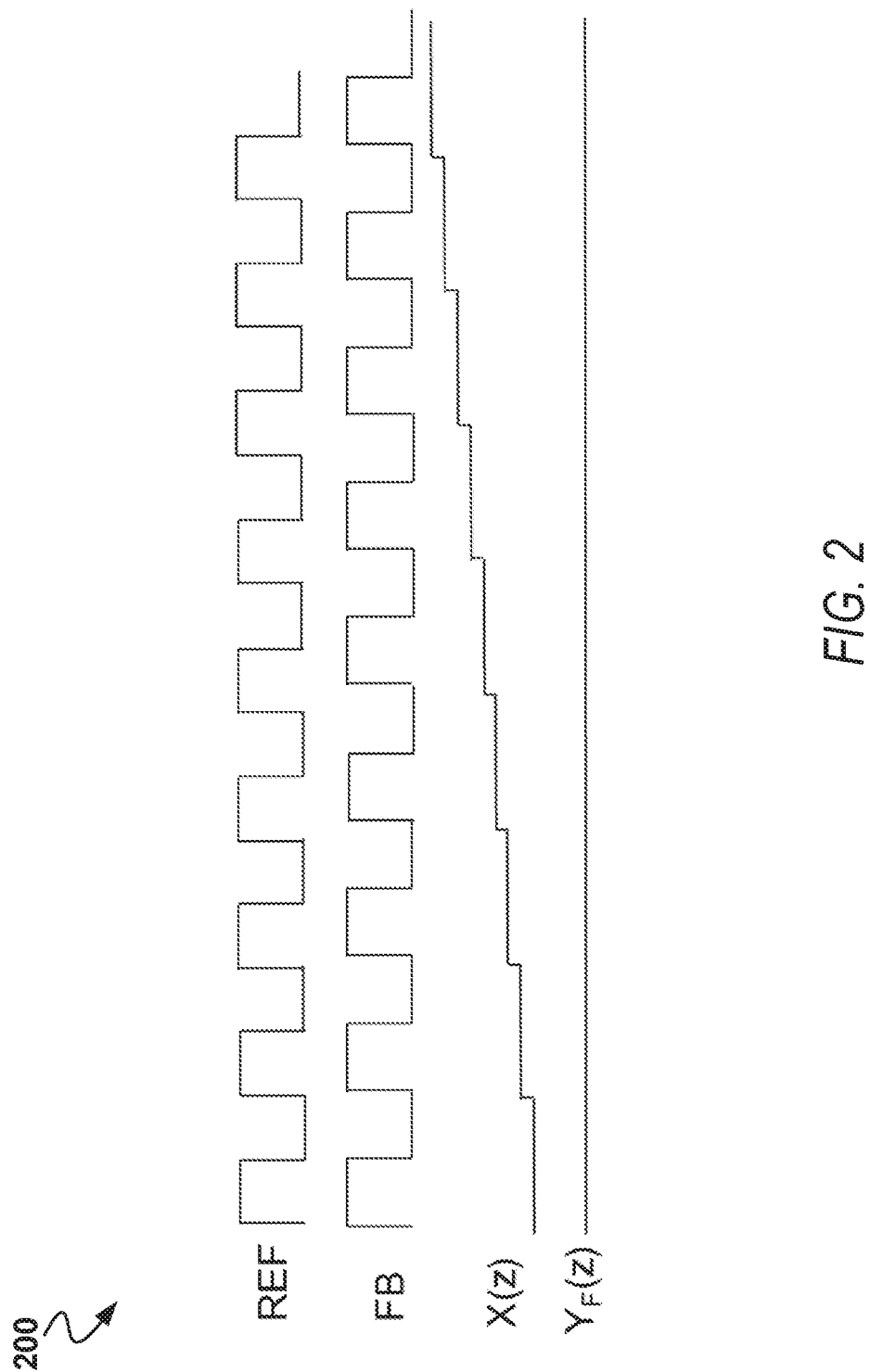
FIG. 2 is a chart illustrating example input and output signals to an example frequency and phase measurement system, in accordance with various embodiments.

FIG. 2 is a chart 200 illustrating example input and output signals to the example frequency and phase measurement system 100, in accordance with various embodiments. In the chart 200, REF signal represents a reference clock, FB signal represents a feedback clock, X(z) signal represents the analog signal X(z) being received by the system 100, and $Y_F(z)$ signal represents the analog signal $Y_F(z)$ being outputted by the system 100. According to some embodiments, X(z) signal represents the phase difference between represents the REF signal and the FB signal, and the $Y_F(z)$ signal represents the frequency difference measured by the system 100 based on the X(z) signal. The chart 200 illustrates that the FB signal is toggling at a lower frequency relative to the REF signal. In turn, this causes the phase difference (represented by the X(z) signal) to increase over time. Meanwhile, the $Y_F(z)$ signal being outputted by the system 100 shows a constant value, thereby indicating that a constant frequency offset exists between the REF signal and the FB signal.

FIGS. 3 through 6 are diagrams illustrating example circuits for measuring frequency and phase, in accordance with various embodiments. In particular, the example circuits illustrated by the FIGS. 3 through 6 represent implementations of the frequency and phase measurement system 100 described above with respect FIG. 1.

Figure 3:
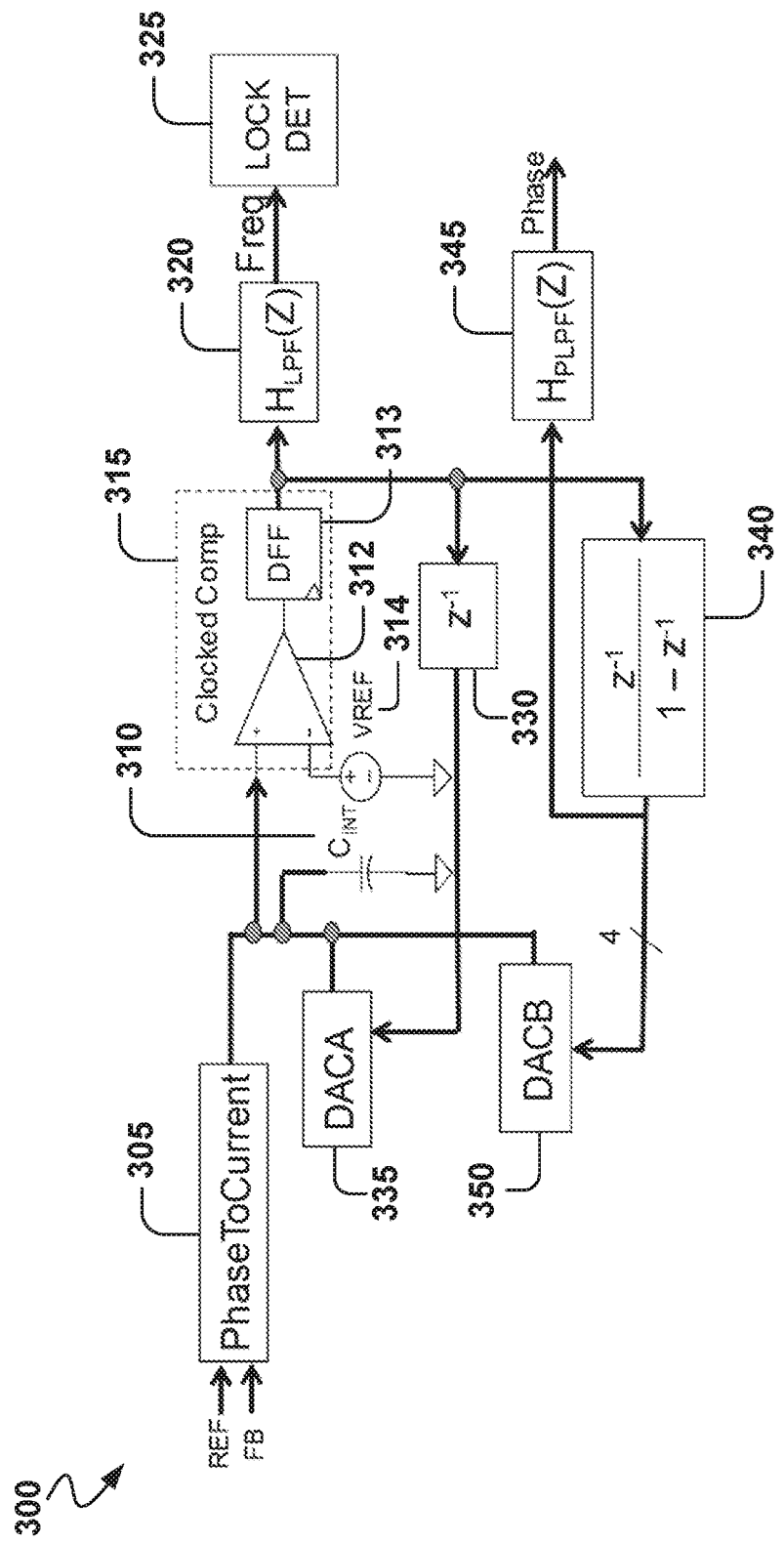
FIGS. 3 through 6 are diagrams illustrating example circuits for measuring frequency and phase, in accordance with various embodiments.

Referring now to FIG. 3, an example circuit 300 is illustrated for measuring frequency and phase based on converting phase to current, in accordance with some embodiments. As shown, the circuit 300 comprises a phase-to-current converter 305, a capacitor 310, a clocked comparator 315, a first low-pass filter 320, lock determination circuitry 325, a delay component 330, a digital integrator 340, a second low-pass filter 345, a digital-to-analog converter (DAC) A 335, and a digital-to-analog converter (DAC) B 350. The phase-to-current converter 305 receives a reference clock and a feedback clock and generates a current (e.g., current pulse) that is proportional to a sampled phase difference between the reference clock and the feedback clock. The DAC 335 generates a current output based on a digital signal received from (and generated by) the delay component 330, and the DAC 350 generates a current output based on a digital signal received from (and generated by) the digital integrator 340. The matching of the current generated by the DAC 335 to relative to the current generated by the DAC 350 can determine the noise transfer function of the circuit 300 at high frequencies. Additionally, the matching of the current generated by the DAC 350 to relative to the current generated by the phase-to-current converter 305 can determine the gain accuracy of the frequency measurement provided by the first low-pass filter 320 and the phase measurement provided by the second low-pass filter 345. The current outputs of the phase-to-current converter 305, the DAC 335, and the DAC 350 are combined together and received by the capacitor 310, which is coupled to ground and functions as an analog integrator with respect to the combined current output.

The combined current output (as affected by the capacitor 310) is eventually received as input to the clocked comparator 315, which generates a digital signal based on the combined current output (e.g., digitizes the analog signal of the combined current output). The clocked comparator 315 can be clocked for high gain without additional gain stages. Additionally, the clocked comparator 315's offset and noise can be suppressed by noise shaping. As shown, the clocked comparator 315 comprises an operational amplifier 312 that is coupled to reference voltage 314 and that receives the combined current output (as affected by the capacitor 310). The clocked comparator 315 further comprises a digital flip-flop 313 that is coupled to the output of the operation amplifier 312 and that outputs the digital signal generated by the clocked comparator 315. The digital signal generated by the clocked comparator 315 is provided to the first low-pass filter 320, the delay component 330, and the digital integrator 340.

The first low-pass filter 320 generates a digital signal based on the digital signal provided by the clocked comparator 315. The digital signal generated by the first low-pass filter 320 can represent a measured frequency difference (e.g., $Y_F(z)$) between the reference clock and the feedback clock received by the phase-to-current converter 305. The digital signal generated by the first low-pass filter 320 can comprise a digital word. For some embodiments, the first low-pass filter 320 comprises a digital filter, such as a FIR filter (e.g., min-phase 36 tap FIR filter). The digital signal generated by the first low-pass filter 320 is provided to the lock determination circuitry 325, which determines a lock condition between the reference clock and the feedback clock based on the provided digital signal.

The delay component 330 generates a delayed digital signal (e.g., delayed by one cycle) based on the digital signal provided by the clocked comparator 315. For some embodiments, the delay component comprises a digital flip-flop. The digital signal generated by the delay component 330 is provided to the DAC 335, which as described herein, generates a current output based on the provided digital signal.

The digital integrator 340 generates a digital signal based on the digital signal provided by the clocked comparator 315. For some embodiments, the digital signal generated by the digital integrator 340 is a time integral of the digital signal received by the digital integrator 340 (the digital signal received from the clocked comparator 315). Depending on the embodiment, the digital signal generated by the digital integrator 340 can comprise a digital word (e.g., 4-bit digital word). For some embodiments, the digital integrator 145 comprises one or more digital filters, such as first-order or second-order IIR filters. The digital signal generated by the digital integrator 340 is provided to the DAC 350 and the second low-pass filter 345.

The digital signal generated by the second low-pass filter 345 can represent a measured phase difference (e.g., $Y_P(z)$) between the reference clock and the feedback clock received by the phase-to-current converter 305. For some embodiments, the phase difference represented by the digital signal generated by the second low-pass filter 345 is more accurate than the phase difference (e.g., X(z)) sampled by (e.g., within) the phase-to-current converter 305. For various embodiments, the second low-pass filter 345 comprises a digital filter, such as an IIR filter (e.g., two cascaded, first-order digital IIR filters).

Figure 4:
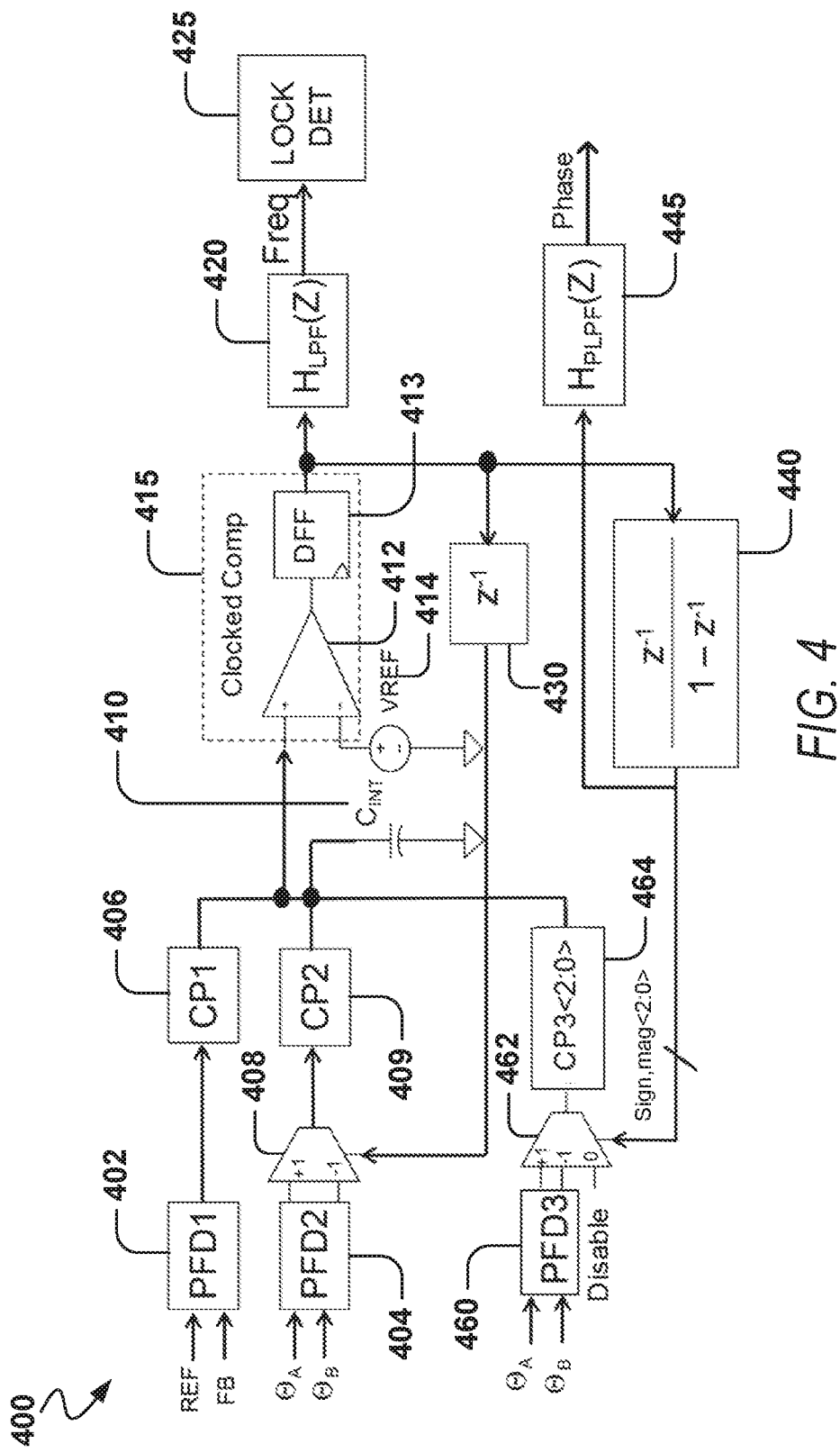

Referring now to FIG. 4, an example circuit 400 is illustrated for measuring frequency and phase based on converting phase to current and using current output digital-to-analog converters (DACs), in accordance with some embodiments. As shown, the circuit 400 comprises a first phase frequency detector (PFD) 402, a second PFD 404, a third PFD 460, a first charge-pump 406, a second charge-pump 409, a third charge-pump 464, a first multiplexer 408, a second multiplexer 462, a capacitor 410, a clocked comparator 415, a first low-pass filter 420, lock determination circuitry 425, a delay component 430, a digital integrator 440, and a second low-pass filter 445. According to some embodiments, the first PFD 402 and the first charge-pump 406 implement a phase-to-current converter (e.g., the phase-to-current converter 305). For some embodiments, the second PFD 404, the first multiplexer 408, and the second charge-pump 409 implement a digital-to-analog converter that outputs a current based on a digital signal provided by the delay component 430. Additionally, for some embodiments, the third PFD 460, the second multiplexer 462, and the third charge-pump 464 implement a digital-to-analog converter that outputs a current based on a digital signal (e.g., 4-bit digital word) provided by the digital integrator 440. The 4-bit digital word provided by the digital integrator 440 can represent a sign and magnitude of a value (e.g., 1 sign bit and 3 magnitude bits).

As shown, the first PFD 402 receives a reference clock and a feedback clock, generates a voltage output based on a sampled phase difference between the reference clock and the feedback clock, and the first charge-pump 406 generate a current based on the voltage output of the first PFD 402. Each of the second PFD 404 and the third PFD 460 receives two clock signals, represented as $\Theta_A$ and $\Theta_B$. For some embodiments, these two clock signals are separated by a known number of clock cycles (e.g., 3 clock cycles). The two clock signals can be generated in a variety of ways, such as by a voltage-controlled oscillator (VCO) or a frequency divider. The second PFD 404 generates a voltage output based on a sampled phase difference between the two clock signals $\Theta_A$ and $\Theta_B$ and provides the voltage output to the first multiplexer 408. The first multiplexer 408 selectively provides the voltage output of the second PFD 404 to the second charge-pump 409 based on a digital signal generated (and provided) by the delay component 430.

The voltage output of the third PFD 460 is provided to the second multiplexer 462, which selectively provides the voltage output of the third PFD 460 to the third charge-pump 464 based on a 4-bit digital word (e.g., representing the current count of 0's and 1's) generated (and provided) by the digital integrator 440. The third charge-pump 464 comprises three binary-weighted charge-pumps (charge-pumps 0 through 2), each of which selectively receives voltage output from third PFD 460 via the second multiplexer 462. For some embodiments, the second multiplexer 462 is controlled by the 4-bit digital word provided by the digital integrator 440 such that the 4-bit digital word determines which of voltage inputs to the second multiplexer 462 (provided by the third PFD 460) are individually received by the three binary-weighted charge-pumps of the third charge-pump 464. In particular, for some embodiments, the 4-bit digital word comprises 1 sign bit and 3 magnitude bits, where the 1 sign bit (represented as sign in FIG. 4) controls the second multiplexer 462, and the 3 magnitude bits (represented as mag<2:0> in FIG. 4) are routed to the third charge-pump 464. Additionally, for some embodiments, the second multiplexer 462 can disable output to individual charge-pumps of the third charge-pump 464, thereby causing those individual charge-pumps to turn off. This can be used as a power save feature of some embodiments (e.g., when an embodiment needs only one or two charge-pumps, the rest can be disabled to save power).

The current outputs of the first charge-pump 406, the second charge-pump 409, and the third charge-pump 464 are combined together and received by the capacitor 410, which is coupled to ground and functions as an analog integrator with respect to the combined current output. According to some embodiments, the capacitor 410, the clocked comparator 415, the first low-pass filter 420, the lock determination circuitry 425, the delay component 430, the digital integrator 440, and the second low-pass filter 445 are respectively similar (e.g., in operation and functionality) to the capacitor 310, the clocked comparator 315, the first low-pass filter 320, the lock determination circuitry 325, the delay component 330, the digital integrator 340, and the second low-pass filter 345 described above with respect to the circuit 300 of FIG. 3.

Figure 5:
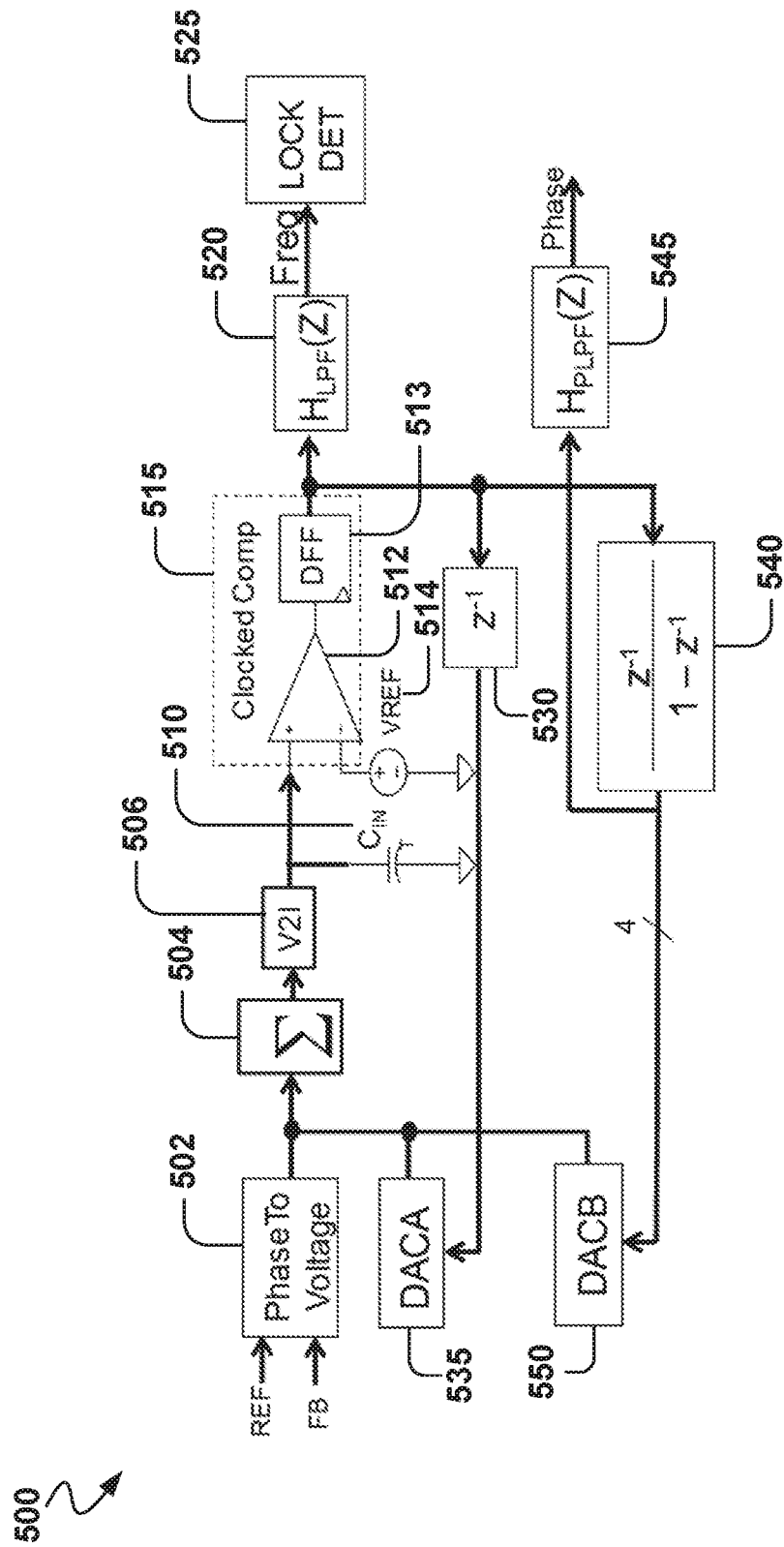

Referring now to FIG. 5, an example circuit 500 is illustrated for measuring frequency and phase based on converting phase to voltage, in accordance with some embodiments. As shown, the circuit 500 comprises a phase-to-voltage converter 502, a voltage summation component 504, a voltage-to-current converter 506, a capacitor 510, a clocked comparator 515, a first low-pass filter 520, lock determination circuitry 525, a delay component 530, a digital integrator 540, a second low-pass filter 545, a digital-to-analog converter (DAC) A 535, and a digital-to-analog converter (DAC) B 550. The phase-to-voltage converter 502 receives a reference clock and a feedback clock and generates a voltage that is proportional to a sampled phase difference between the reference clock and the feedback clock. The DAC 535 generates a voltage output based on a digital signal received from (and generated by) the delay component 530, and the DAC 550 generates a voltage output based on a digital signal received from (and generated by) the digital integrator 540. The matching of the voltage generated by the DAC 535 to relative to the voltage generated by the DAC 550 can determine the noise transfer function of the circuit 500 at high frequencies. Additionally, the matching of the voltage generated by the DAC 550 to relative to the voltage generated by the phase-to-voltage converter 502 can determine the gain accuracy of the frequency measurement provided by the first low-pass filter 520 and the phase measurement provided by the second low-pass filter 545. The voltage outputs of the phase-to-voltage converter 502, the DAC 535, and the DAC 550 are combined (e.g., summed) together by the voltage summation component 504 and outputted by the voltage summation component 504 to the voltage-to-current converter 506. The voltage-to-current converter 506 receives the voltage output from the voltage summation component 504 and generates a current output based on the received voltage output. For some embodiments, the voltage summation component 504 and the voltage-to-current converter 506 are implemented by an integrating amplifier.

The current output of the voltage-to-current converter 506 is received as input to the clocked comparator 515, which generates a digital signal based on the combined current output. The clocked comparator 515 can be clocked for high gain without gain stages. Additionally, the clocked comparator 515's offset and noise can be suppressed by noise shaping. As shown, the clocked comparator 515 comprises an operational amplifier 512 that is coupled to reference voltage 514 and that receives the combined current output (as affected by the capacitor 510). The clocked comparator 515 further comprises a digital flip-flop 513 that is coupled to the output of the operation amplifier 512 and that outputs the digital signal generated by the clocked comparator 515. The digital signal generated by the clocked comparator 515 is provided to the first low-pass filter 520, the delay component 530, and the digital integrator 540.

The first low-pass filter 520 generates a digital signal based on the digital signal provided by the clocked comparator 515. The digital signal generated by the first low-pass filter 520 can represent a measured frequency difference (e.g., $Y_F(z)$) between the reference clock and the feedback clock received by the phase-to-current converter 505. The digital signal generated by the first low-pass filter 520 can comprise a digital word. For some embodiments, the first low-pass filter 520 comprises a digital filter, such as a FIR filter (e.g., min-phase 56 tap FIR filter). The digital signal generated by the first low-pass filter 520 is provided to the lock determination circuitry 525, which determines a lock condition between the reference clock and the feedback clock based on the provided digital signal.

The delay component 530 generates a delayed digital signal (e.g., delayed by one cycle) based on the digital signal provided by the clocked comparator 515. For some embodiments, the delay component comprises a digital flip-flop. The digital signal generated by the delay component 530 is provided to the DAC 535, which as described herein, generates a voltage output based on the provided digital signal.

The digital integrator 540 generates a digital signal based on the digital signal provided by the clocked comparator 515. For some embodiments, the digital signal generated by the digital integrator 540 is a time integral of the digital signal received by the digital integrator 540 (the digital signal received from the clocked comparator 515). Depending on the embodiment, the digital signal generated by the digital integrator 540 can comprise a digital word (e.g., 4-bit digital word). For some embodiments, the digital integrator 145 comprises one or more digital filters, such as first-order or second-order IIR filters. The digital signal generated by the digital integrator 540 is provided to the DAC 550 and the second low-pass filter 545.

The digital signal generated by the second low-pass filter 545 can represent a measured phase difference (e.g., $Y_P(z)$) between the reference clock and the feedback clock received by the phase-to-current converter 505. For some embodiments, the phase difference represented by the digital signal generated by the second low-pass filter 545 is more accurate than the phase difference (e.g., $X(z)$) sampled by (e.g., within) the phase-to-current converter 505. For various embodiments, the second low-pass filter 545 comprises a digital filter, such as an IIR filter (e.g., two cascaded, first-order digital IIR filters).

Figure 6:
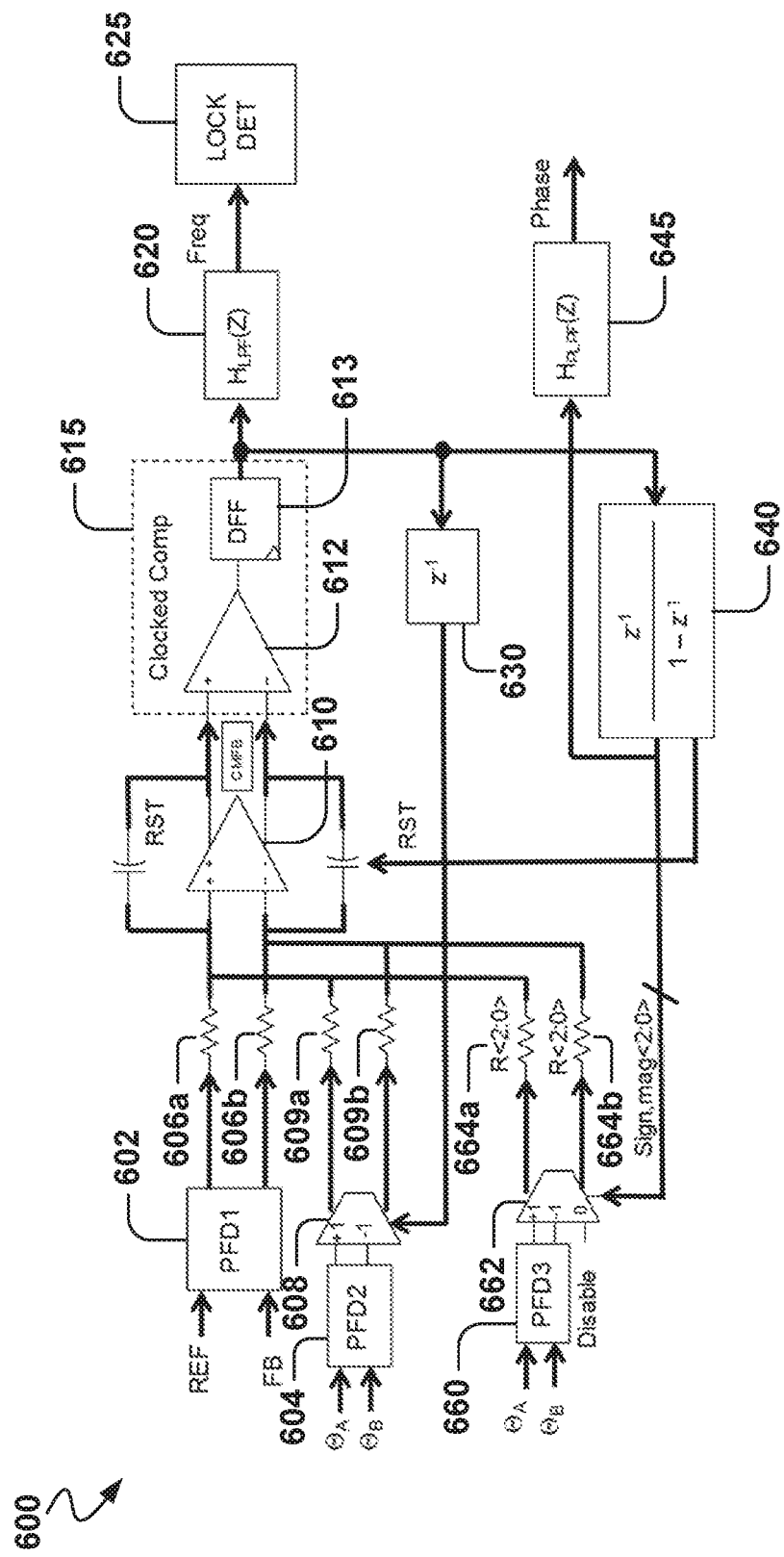

Referring now to FIG. 6, an example circuit 600 is illustrated for measuring frequency and phase based on converting phase to voltage and using voltage output digital-to-analog converters (DACs), in accordance with some embodiments. For some embodiments, the circuit 600 uses resistors 606, 609, 664 and an integrating amplifier 610 to implement a differential system. The ability to accurately match resistors 606, 609, 664 can permit some embodiments to obviate the concern of gain errors. As shown, the circuit 600 comprises a first PFD 602, a second PFD 604, a third PFD 660, a first plurality of resistors 606 (606a and 606b)

arranged in parallel, a second plurality of resistors 609 (609a and 609b) arranged in parallel, a third plurality of resistors 664 (resistors 664a paired with resistors 664b) arranged in parallel, the integrating amplifier 610, a first multiplexer 608, a second multiplexer 662, a clocked comparator 615, a first low-pass filter 620, lock determination circuitry 625, a delay component 630, a digital integrator 640, and a second low-pass filter 645. According to some embodiments, the first PFD 602 and the first plurality of resistors 606 implement a phase-to-voltage converter (e.g., the phase-to-voltage converter 502). For some embodiments, the second PFD 604, the first multiplexer 608, and the second plurality of resistors 609 implement a digital-to-analog converter that outputs a voltage based on a digital signal provided by the delay component 630. Additionally, for some embodiments, the third PFD 660, the second multiplexer 662, and the third plurality of resistors 664 implement a digital-to-analog converter that outputs a voltage based on a digital signal (e.g., 4-bit digital word) provided by the digital integrator 640.

As shown, the first PFD 602 receives a reference clock and a feedback clock, and generates a voltage output based on a sampled phase difference between the reference clock and the feedback clock. The first plurality of resistors 606 couple the output of the first PFD 602 to the integrating amplifier 610. Each of the second PFD 604 and the third PFD 660 receives two clock signals, represented as $\Theta_A$ and $\Theta_B$. For some embodiments, these two clock signals are separated by a known number of clock cycles (e.g., 3 clock cycles). The two clock signals can be generated in a variety of ways, such as by a voltage-controlled oscillator (VCO) or a frequency divider. The second PFD 604 generates a voltage output based on a sampled phase difference between the two clock signals $\Theta_A$ and $\Theta_B$ and provides the voltage output to the first multiplexer 608. The first multiplexer 608 selectively provides the voltage output of the second PFD 604 to the second plurality of resistors 609 based on a digital signal generated (and provided) by the delay component 630.

The voltage output of the third PFD 660 is provided to the second multiplexer 662, which selectively provides the voltage output of the third PFD 660 to the third plurality of resistors 664 based on a 4-bit digital word (e.g., representing the current count of 0's and 1's) generated (and provided) by the digital integrator 640. The 4-bit digital word provided by the digital integrator 640 can represent a sign and magnitude of a value (e.g., 1 sign bit and 3 magnitude bits). The third plurality of resistors 664 comprises resistors 664a (e.g., resistors 0 through 2) paired and arranged in parallel with resistors 664b (e.g., resistors 0 through 2). Each pairing of resistors in the third plurality of resistors 664 selectively receives voltage output from third PFD 660 via the second multiplexer 662. For some embodiments, the second multiplexer 662 is controlled by the 4-bit digital word provided by the digital integrator 640 such that the 4-bit digital word determines which voltage inputs to the second multiplexer 662 (provided by the third PFD 660) are individually received by the pairs of resistors of the third plurality of resistors 664. In particular, for some embodiments, the 4-bit digital word comprises 1 sign bit and 3 magnitude bits, where the 1 sign bit (represented as sign in FIG. 6) controls the second multiplexer 662, and the 3 magnitude bits (represented as mag<2:0> in FIG. 6) are routed to the plurality of resistors 664. Additionally, for some embodiments, the second multiplexer 662 can disable output to individual pairs of resistors of the third plurality of resistors 664, thereby effectively causing those individual resistor pairs to be turned off. This can be used as a power save feature of some embodiments.

The voltage outputs of the first plurality of resistors 606, the plurality of resistors 609, and the third plurality of resistors 664 are combined together and received by the integrating amplifier 610, which functions as an analog integrator with respect to the combined voltages output. According to some embodiments, the clocked comparator 615, the first low-pass filter 620, the lock determination circuitry 625, the delay component 630, the digital integrator 640, and the second low-pass filter 645 are respectively similar (e.g., in operation and functionality) to the clocked comparator 515, the first low-pass filter 520, the lock determination circuitry 525, the delay component 530, the digital integrator 540, and the second low-pass filter 545 described above with respect to the circuit 500 of FIG. 5.

Figure 7:
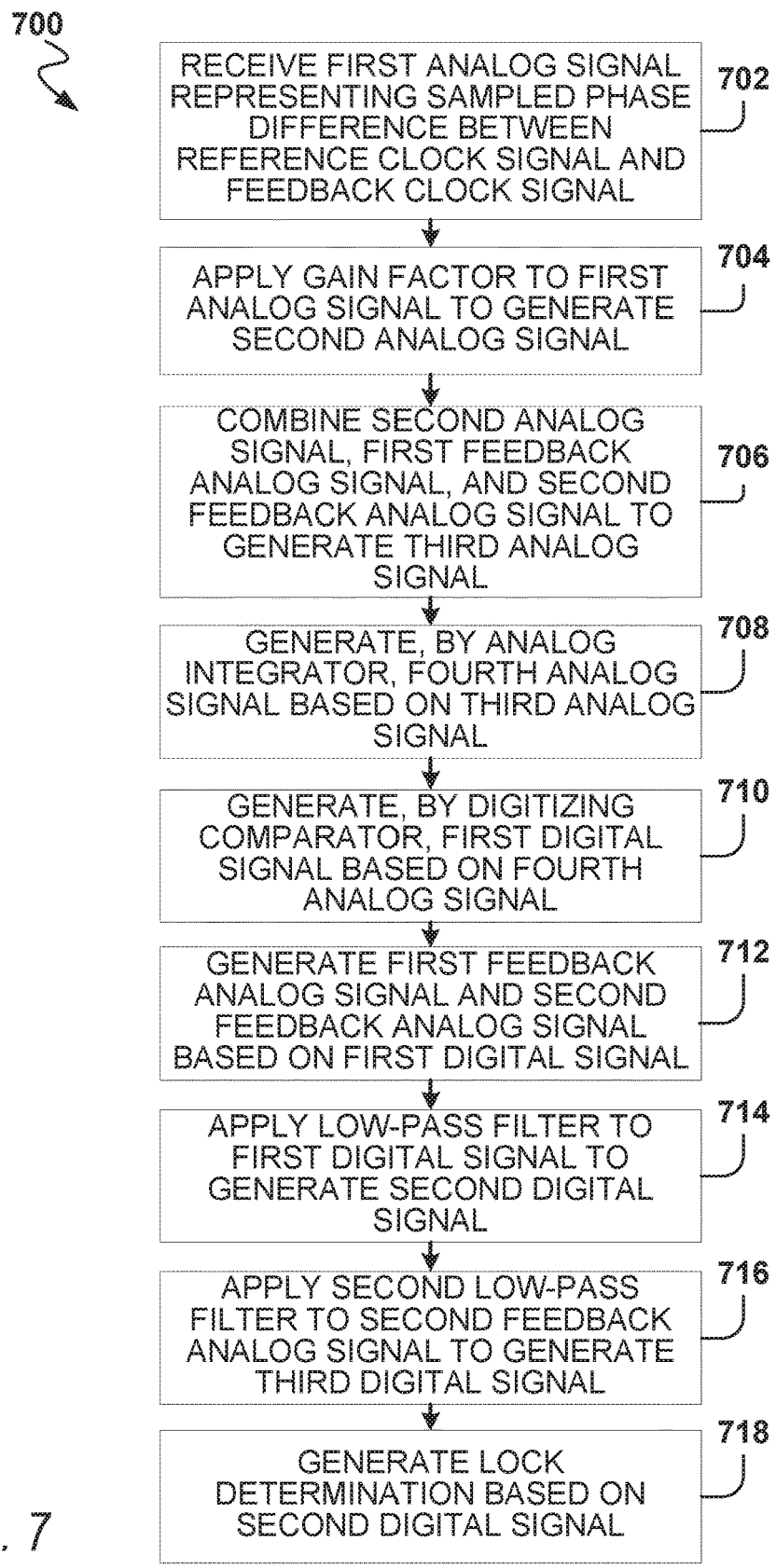
FIG. 7 is a flowchart illustrating an example method for measuring frequency and phase, in accordance with various embodiments.

FIG. 7 is a flowchart illustrating an example method 700 for measuring frequency and phase, in accordance with various embodiments. Some or all of the method 700 may be performed by a circuit implementing a frequency and phase measurement system (e.g., system 100) of an embodiment described herein. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

As illustrated, the method 700 begins with operation 702, where a first analog signal is received (e.g., X(z) received by the first gain component 105). The first analog signal can represent a sampled phase difference between a reference clock signal and a feedback clock signal. The method 700 continues with operation 704, a gain factor is applied (e.g., by the first gain component 105) to the first analog signal to generate a second analog signal. The method 700 continues with operation 706, where the second analog signal, a first feedback analog signal, and a second feedback analog signal are combined (e.g., by the combiner component 110) to generate a third analog signal. The method 700 continues with operation 708, where a fourth analog signal is generated (e.g., by an analog integrator (e.g., the analog integrator 115) based on the third analog signal. The method 700 continues with operation 710, where a first digital signal is generated by a comparator (e.g., the comparator 120) based on the fourth analog signal.

The method 700 continues with operation 712, where the first feedback analog signal is generated (e.g., by feed-forward feedback path of the system 100) based on the first digital signal, and the second feedback analog signal is generated (e.g., by integrator feedback path of the system 100) based on the first digital signal. For some embodiments, generating the first feedback analog signal based on the second digital signal comprises applying (e.g., by the delay component 135) a cycle delay to the second digital signal to generate a delayed second digital signal, and applying a second gain factor (e.g., by the second gain component 140) to the delayed second digital signal to generate the first feedback analog signal. Additionally, for some embodiments, generating the second feedback analog signal based on the second digital signal comprises: generating, by a digital integrator (e.g., digital integrator 145), a third digital signal based on the second digital signal, where the digital integrator implements a cycle delay; and then applying a second gain factor (e.g., by the third gain component 150) to the third digital signal to generate the second feedback analog signal.

The method 700 continues with operation 714, where a low-pass filter (e.g., the first low-pass filter 125) is applied to the first digital signal to generate a second digital signal. The second digital signal can represent a measured frequency difference (e.g., $Y_F(z)$) between the reference clock signal and the feedback clock signal.

The method 700 continues with operation 716, where a second low-pass filter (e.g., the second low-pass filter 155) is applied to the second feedback analog signal to generate a third digital signal. The third digital signal can represent a measured phase difference (e.g., $Y_P(z)$) between the reference clock signal and the feedback clock signal. For some embodiments, the measured phase difference represented by the third digital signal is used to improve or enable testability of a circuit, such as a PLL as described herein.

The method 700 continues with operation 718, where a lock determination is determined (e.g., by the lock determination circuitry 130) for the reference clock signal and the feedback clock signal based on the second digital signal generated by operation 714. As described herein, the second digital signal can represent a measured frequency difference (e.g., $Y_F(z)$) between the reference clock signal and the feedback clock signal.

Figure 8:
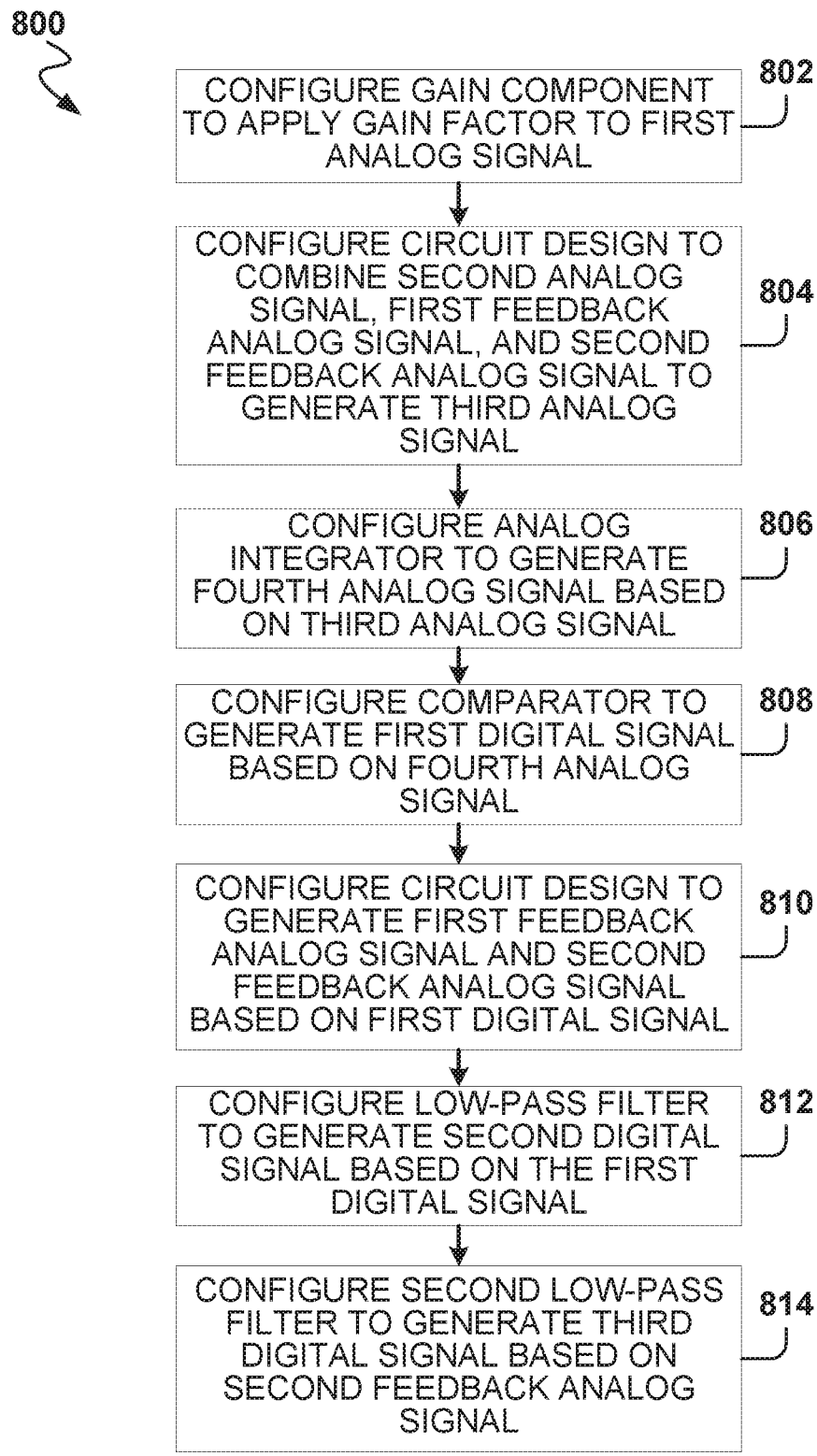
FIG. 8 is a flowchart illustrating an example method for generating a circuit design including a frequency and phase measurement circuit, in accordance with various embodiments.

FIG. 8 is a flowchart illustrating an example method 800 for generating a circuit design including a frequency and phase measurement circuit, in accordance with various embodiments. It will be understood that the method 800 may be performed by a device, such as a computing device executing instructions of an EDA software system, in accordance with some embodiments. Additionally, the method 800 herein may be implemented in the form of executable instructions stored on a computer-readable medium or in the form of electronic circuitry. For instance, the operations of the method 800 may be represented by executable instructions that, when executed by a processor of a computing device, cause the computing device to perform the method 800. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Referring now to FIG. 8, the method 800 as illustrated begins with operation 802, where a gain component in a circuit design is configured to receive a first analog signal representing a sampled phase difference between a reference clock signal and a feedback clock signal, and to apply a gain factor to the first analog signal to generate a second analog signal. The method 800 continues with operation 804, where the circuit design is configured to combine the second analog signal, a first feedback analog signal, and a second feedback analog signal to generate a third analog signal. The method 800 continues with operation 806, where an analog integrator in the circuit design is configured to generate a fourth analog signal based on the third analog signal. The method 800 continues with operation 808, where a comparator in the circuit design is configured to generate a first digital signal based on the fourth analog signal.

The method 800 continues with operation 810, where the circuit design is configured to generate the first feedback analog signal and the second feedback analog signal based on the first digital signal. For some embodiments, configuring the circuit design to generate the first feedback analog signal based on the first digital signal comprises configuring, in the circuit design, a delay component to apply a cycle delay to the second digital signal to generate a delayed second digital signal; and configuring, in the circuit design, a second gain component to apply a second gain factor to the delayed second digital signal to generate the first feedback analog signal. Additionally, for some embodiments, configuring the circuit design to generate the second feedback analog signal based on the first digital signal comprises: configuring, in the circuit design, a digital integrator to generate a third digital signal based on the second digital signal, wherein the digital integrator has a cycle delay; and configuring, in the circuit design, a second gain component to apply a second gain factor to the third digital signal to generate the second feedback analog signal.

The method 800 continues with operation 812, where a low-pass filter in the circuit design is configured to generate a second digital signal based on the first digital signal. As described herein, the second digital signal can represent a measured frequency difference between the reference clock signal and the feedback clock signal. The method 800 continues with operation 814, where a second low-pass filter in the circuit design is configured to generate a third digital signal based on the second feedback analog signal. As described herein, the third digital signal can represent a measured phase difference between the reference clock signal and the feedback clock signal.

Figure 9:
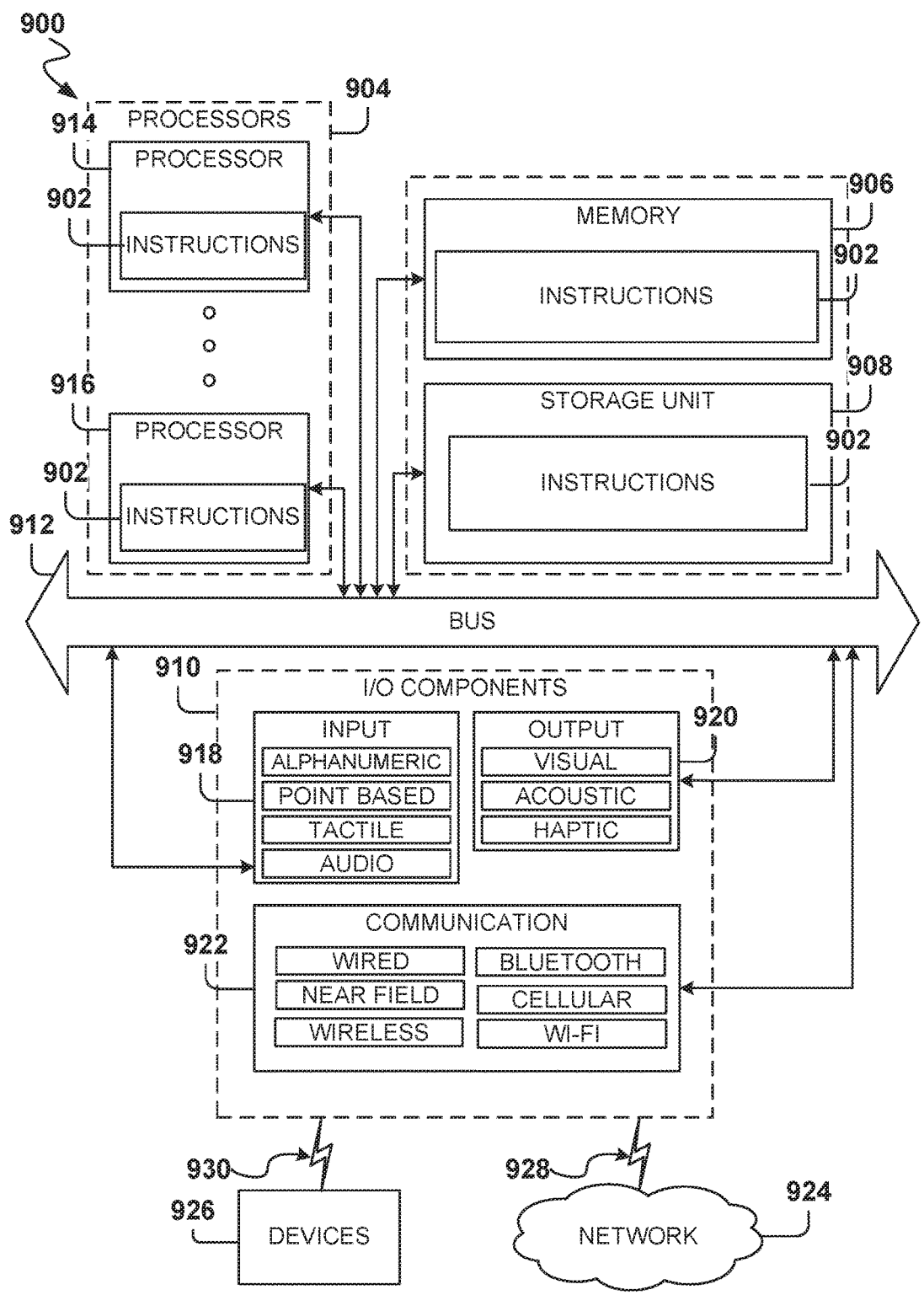
FIG. 9 is a block diagram illustrating components of a machine, according to some example embodiments, able to read instructions from a machine-readable medium and perform any one or more of the methodologies discussed herein.

FIG. 9 is a block diagram illustrating components of a machine 900, according to some example embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a system, within which instructions 902 (e.g., software, a program, an application, an applet, an app, a driver, or other executable code) for causing the machine 900 to perform any one or more of the methodologies discussed herein may be executed. For example, the instructions 902 include executable code that causes the machine 900 to execute the method 800. In this way, these instructions 902 transform the general, non-programmed machine 900 into a particular machine programmed to carry out the described and illustrated method 800 in the manner described herein. The machine 900 may operate as a standalone device or may be coupled (e.g., networked) to other machines.

By way of non-limiting example, the machine 900 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 902, sequentially or otherwise, that specify actions to be taken by the machine 900. Further, while only a single machine 900 is illustrated, the term "machine" shall also be taken to include a collection of machines 900 that individually or jointly execute the instructions 902 to perform any one or more of the methodologies discussed herein.

The machine 900 may include processors 904, memory 906, a storage unit 908, and I/O components 910, which may be configured to communicate with each other such as via a bus 912. In an example embodiment, the processors 904 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 914 and a processor 916 that may execute the instructions 902. The term "processor" is intended to include multi-core processors 904 that may comprise two or more independent processors (sometimes referred to as "cores") that may execute instructions 902 contemporaneously. Although FIG. 9 shows multiple processors 904, the machine 900 may include a single processor with a single core, a single processor with multiple cores (e.g., a multi-core processor), multiple processors with a single core, multiple processors with multiple cores, or any combination thereof.

The memory 906 (e.g., a main memory or other memory storage) and the storage unit 908 are both accessible to the processors 904 such as via the bus 912. The memory 906 and the storage unit 908 store the instructions 902 embodying any one or more of the methodologies or functions described herein. The instructions 902 may also reside, completely or partially, within the memory 906, within the storage unit 908, within at least one of the processors 904 (e.g., within the processor's cache memory), or any suitable combination thereof, during execution thereof by the machine 900. Accordingly, the memory 906, the storage unit 908, and the memory of the processors 904 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 902. The term "machine-readable medium" shall also be taken to include any medium, or combination of multiple media, that is capable of storing instructions (e.g., instructions 902) for execution by a machine (e.g., machine 900), such that the instructions, when executed by one or more processors of the machine (e.g., processors 904), cause the machine to perform any one or more of the methodologies described herein (e.g., method 800). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 910 may include a wide variety of components to receive input, provide output, produce output, transmit information, exchange information, capture measurements, and so on. The specific I/O components 910 that are included in a particular machine 900 will depend on the type of the machine 900. For example, portable machines such as mobile phones will likely include a touch input device or other such input mechanisms, while a headless server machine will likely not include such a touch input device. It will be appreciated that the I/O components 910 may include many other components that are not specifically shown in FIG. 9. The I/O components 910 are grouped according to functionality merely for simplifying the following discussion and the grouping is in no way limiting. In various example embodiments, the I/O components 910 may include input components 918 and output components 920. The input components 918 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 920 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 910 may include communication components 922 operable to couple the machine 900 to a network 924 or devices 926 via a coupling 928 and a coupling 930 respectively. For example, the communication components 922 may include a network interface component or another suitable device to interface with the network 924. In further examples, the communication components 922 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 926 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 10:
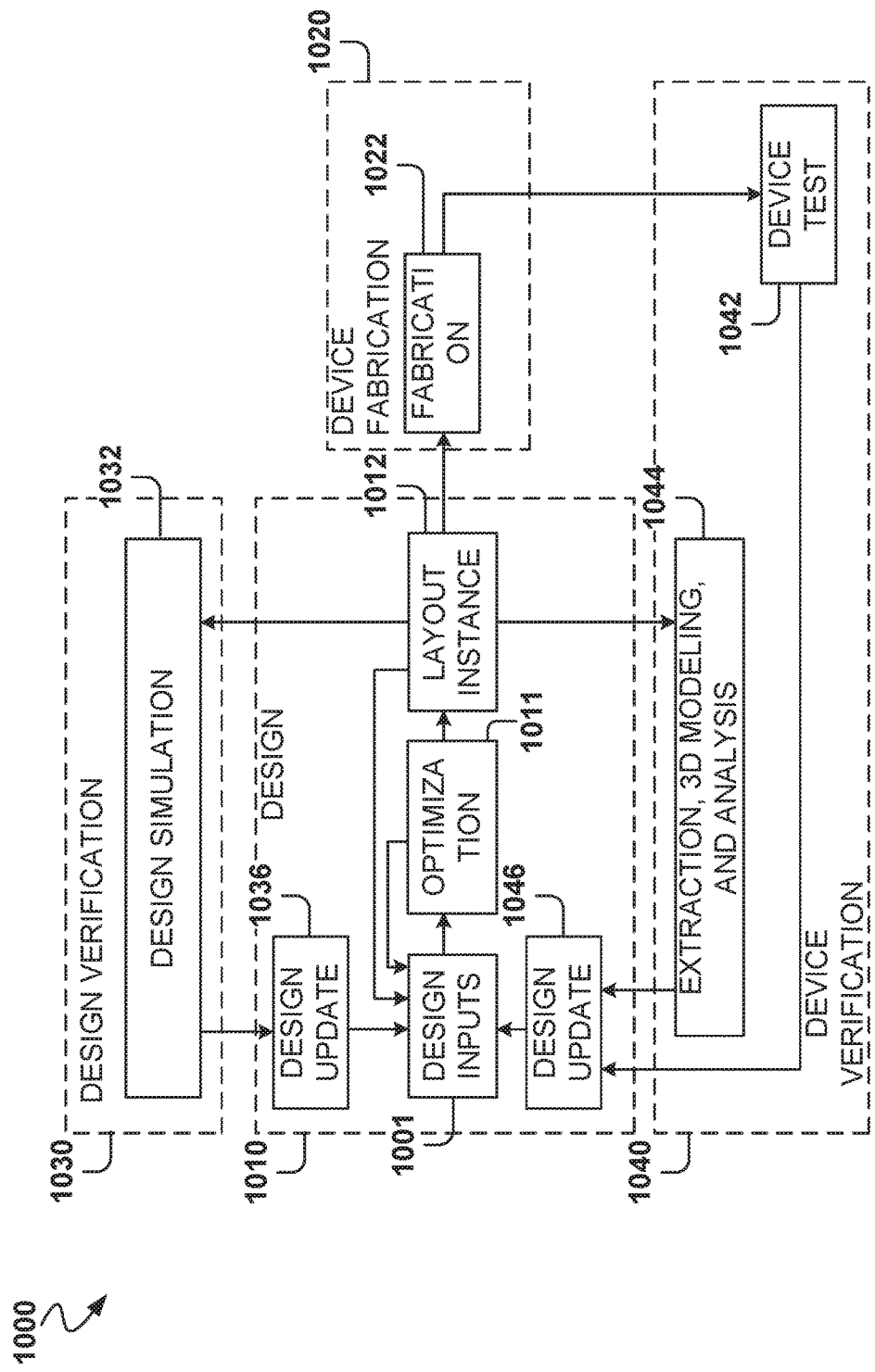
FIG. 10 is a diagram illustrating one possible design process flow for generating a circuit, including embodiments to implement a frequency and phase measurement circuit as described herein, and in various embodiments, to integrate the frequency and phase measurement circuit with a larger integrated circuit comprising different design blocks.

FIG. 10 is a diagram illustrating one possible design process flow for generating a circuit, including embodiments to implement a frequency and phase measurement circuit as described herein, and in various embodiments, to integrate the frequency and phase measurement circuit with a larger integrated circuit comprising different design blocks. As illustrated, the overall design flow 1000 includes a design phase 1010, a device fabrication phase 1020, a design verification phase 1030, and a device verification phase 1040. The design phase 1010 involves an initial design input operation 1001 where the basic elements and functionality of a device are determined, as well as revisions based on various analyses and optimization of a circuit design. This design input operation 1001 is where instances of an EDA circuit design file are used in the design and any additional circuitry is selected. The initial strategy, tactics, and context for the device to be created are also generated in the design input operation 1001, depending on the particular design algorithm to be used.

In some embodiments, following an initial selection of design values in the design input operation 1001, timing analysis and optimization according to various embodiments occurs in an optimization operation 1011, along with any other automated design processes. One such process may be the automated design of a partitioned root search for error locator polynomial functions in RS FEC decoding. As described below, design constraints for blocks of a circuit design generated with design inputs in the design input operation 1001 may be analyzed using hierarchical timing analysis, according to various embodiments. While the design flow 1000 shows such optimization occurring prior to a layout instance 1012, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1022.

After design inputs are used in the design input operation 1001 to generate a circuit layout, and any optimization operations 1011 are performed, a layout is generated in the layout instance 1012. The layout describes the physical layout dimensions of the device that match the design inputs. This layout may then be used in the device fabrication operation 1022 to generate a device, or additional testing and design updates may be performed using designer inputs or automated updates based on design simulation 1032 operations or extraction, 3D modeling, and analysis 1044 operations. Once the device is generated, the device can be tested as part of device test 1042 operations, and layout modifications generated based on actual device performance.

As described in more detail below, design updates 1036 from the design simulation 1032, design updates 1046 from the device test 1042, the 3D modeling and analysis 1044 operations, or the design input operation 1001 may occur after an initial layout instance 1012 is generated. In various embodiments, whenever design inputs are used to update or change an aspect of a circuit design, a timing analysis and optimization operation 1011 may be performed.

For example, in various embodiments, a user may provide an input to a computing device indicating placement of elements of a circuit within a first portion of a circuit design, including description of circuitry for a frequency and phase measurement circuit described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
a phase-to-current converter to receive a reference clock signal and a feedback clock signal, and generate an output current based on a sampled phase difference between the reference clock signal and the feedback clock signal;
an analog integrator, coupled to an output of the phase-to-current converter, to generate an output analog signal that is a time integral of the output current received from the phase-to-current converter;

a clocked comparator, coupled to an output of the analog integrator, to convert the output analog signal from the analog integrator to a first digital signal;

a low-pass filter, coupled to an output of the clocked comparator, to generate a first output signal based on the first digital signal received from the clocked comparator, the first output signal representing a measured frequency difference between the reference clock signal and the feedback clock signal;

a delay component, coupled to the output of the clocked comparator, to apply a cycle delay to the first digital signal from the clocked comparator;

a first digital-to-analog converter coupled to an output of the delay component, the analog integrator further being coupled to an output of the first digital-to-analog converter;

a digital integrator, coupled to the output of the clocked comparator, to generate a second digital signal that is a time integral of the first digital signal from the clocked comparator, the digital integrator applying the cycle delay; and a second digital-to-analog converter coupled to an output of the digital integrator, the analog integrator further being coupled to an output of the second digital-to-analog converter.

2. The circuit of claim 1, further comprising a second low-pass filter coupled to the output of the digital integrator, the second low-pass filter generating a second output signal representing a measured phase difference between the reference clock signal and the feedback clock signal.

3. The circuit of claim 2, wherein each of the first output signal and the second output signal comprises a digital word.

4. The circuit of claim 1, wherein the clocked comparator comprises an operational amplifier and a digital flip-flop coupled to an output of the operational amplifier.

5. The circuit of claim 1, wherein the analog integrator comprises a capacitor coupled to ground.

6. The circuit of claim 1, wherein the second digital second comprises a digital word.

7. A circuit comprising:

a phase-to-voltage converter to receive a reference clock signal and a feedback clock signal, and generate an output voltage based on a sampled phase difference between the reference clock signal and the feedback clock signal;

a voltage summation component, coupled to an output of the phase-to-voltage converter, to combine one or more voltages received by the voltage summation component;

a voltage-to-current converter, coupled to an output of the voltage summation component, to generate an output current based on a combined voltage received from the voltage summation component;

an analog integrator, coupled to an output of the voltage-to-current converter, to generate an output analog signal that is a time integral of the output current received from the voltage-to-current converter;

a clocked comparator, coupled to an output of the analog integrator, to convert the output analog signal from the analog integrator to a first digital signal;

a low-pass filter, coupled to an output of the clocked comparator, to generate a first output signal based on the first digital signal received from the clocked comparator, the first output signal representing a measured frequency difference between the reference clock signal and the feedback clock signal;

a delay component, coupled to the output of the clocked comparator, to apply a cycle delay to the first digital signal from the clocked comparator;

a first digital-to-analog converter coupled to an output of the delay component, the analog integrator further being coupled to an output of the first digital-to-analog converter;

a digital integrator, coupled to the output of the clocked comparator, to generate a second digital signal that is a time integral of the first digital signal from the clocked comparator, the digital integrator applying the cycle delay; and a second digital-to-analog converter coupled to an output of the digital integrator, the analog integrator further being coupled to an output of the second digital-to-analog converter.

8. The circuit of claim 7, further comprising a second low-pass filter coupled to the output of the digital integrator, the second low-pass filter generating a second output signal representing a measured phase difference between the reference clock signal and the feedback clock signal.

9. The circuit of claim 8, wherein each of the first output signal and the second output signal comprises a digital word.

10. The circuit of claim 7, wherein the analog integrator comprises a capacitor coupled to ground.

11. The circuit of claim 7, wherein the second digital second comprises a digital word.

12. A method comprising:

receiving a first analog signal representing a sampled phase difference between a reference clock signal and a feedback clock signal;

applying a gain factor to the first analog signal to generate a second analog signal;

combining the second analog signal, a first feedback analog signal, and a second feedback analog signal to generate a third analog signal;

generating, by an analog integrator, a fourth analog signal based on the third analog signal;

generating, by a comparator, a first digital signal based on the fourth analog signal;

generating the first feedback analog signal and the second feedback analog signal based on the first digital signal; and applying a low-pass filter to the first digital signal to generate a second digital signal, the second digital signal representing a measured frequency difference between the reference clock signal and the feedback clock signal.

13. The method of claim 12, wherein the generating the first feedback analog signal based on the second digital signal comprises:

applying a cycle delay to the second digital signal to generate a delayed second digital signal; and applying a second gain factor to the delayed second digital signal to generate the first feedback analog signal.

14. The method of claim 12, wherein the generating the second feedback analog signal based on the second digital signal comprises:

generating, by a digital integrator, a third digital signal based on the second digital signal, wherein the digital integrator has a cycle delay; and applying a second gain factor to the third digital signal to generate the second feedback analog signal.

15. The method of claim 14, further comprising applying a second low-pass filter to the second feedback analog signal to generate a third digital signal, the third digital signal representing a measured phase difference between the reference clock signal and the feedback clock signal.

16. The method of claim 12, further comprising generating, based on the second digital signal, a lock determination for the reference clock signal and the feedback clock signal.

* * * * *